United States Patent
Nomaru

(10) Patent No.: US 9,285,211 B2
(45) Date of Patent: Mar. 15, 2016

(54) HEIGHT DETECTING APPARATUS

(71) Applicant: DISCO CORPORATION, Tokyo (JP)

(72) Inventor: Keiji Nomaru, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/679,220

(22) Filed: Apr. 6, 2015

(65) Prior Publication Data

US 2015/0292865 A1 Oct. 15, 2015

(30) Foreign Application Priority Data

Apr. 9, 2014 (JP) ................................. 2014-080331

(51) Int. Cl.
G01B 11/06 (2006.01)
(52) U.S. Cl.
CPC .................................. G01B 11/0608 (2013.01)
(58) Field of Classification Search
USPC ......... 356/625–636; 250/459.1, 458.1, 201.3, 250/206, 561
See application file for complete search history.

(56) References Cited

U.S. PATENT DOCUMENTS

| 5,248,876 | A | * | 9/1993 | Kerstens et al. | ......... 250/559.05 |
| 5,510,894 | A | * | 4/1996 | Batchelder et al. | ........... 356/301 |
| 2004/0012844 | A1 | * | 1/2004 | Ohtsuki et al. | ............. 359/341.1 |
| 2012/0089365 | A1 | * | 4/2012 | Fay et al. | ....................... 702/167 |
| 2013/0119277 | A1 | * | 5/2013 | Atzler et al. | ............... 250/459.1 |

FOREIGN PATENT DOCUMENTS

| JP | 2002-192370 | 7/2002 |
| JP | 2010-272697 | 12/2010 |
| JP | 2011-082354 | 4/2011 |

* cited by examiner

Primary Examiner — Sang Nguyen
(74) Attorney, Agent, or Firm — Greer Burns & Crain, Ltd.

(57) ABSTRACT

A height detecting apparatus for detecting the height of a workpiece held on a chuck table. The height detecting apparatus includes a single-mode fiber for transmitting return light reflected from the workpiece and next branched by a fiber coupler, a photodetector for detecting the return light emerging from the single-mode fiber and outputting a signal corresponding to the intensity of the return light detected above, and a controller having a memory for storing a table setting the relation between wavelength and height. The controller determines the wavelength corresponding to the highest light intensity from the wavelengths detected by the photodetector in synchronism with the predetermined cycles of sweeping of light having a single wavelength by a Fabry-Perot tunable filter, and then checks this determined wavelength against the wavelength and height set in the table, thereby determining the height of the workpiece held on the chuck table.

3 Claims, 10 Drawing Sheets

FIG.6

CONTROL TABLE

| WAVELENGTH (nm) | HEIGHT (μm) |
|---|---|
| 400 | +50 |
| 410 | +48 |
| 420 | +45 |
| 430 | +42.5 |
| 440 | +40 |
| 450 | +37.5 |
| 460 | +35 |
| 470 | +32.5 |
| 480 | +30 |
| 490 | +27.5 |
| 500 | +25 |
| 600 | 0 |
| 700 | −25 |
| 710 | −27.5 |
| 720 | −30 |
| 730 | −32.5 |
| 740 | −35 |
| 750 | −37.5 |
| 760 | −40 |
| 770 | −42.5 |
| 780 | −45 |
| 790 | −48 |
| 800 | −50 |

VARIATIONS IN HEIGHT AT XY
COORDINATES WITH RESPECT TO REFERENCE HEIGHT

| XY COORDINATES | HEIGHT ($\mu$m) |
|---|---|
| $X_1, Y_1$ | −30 |
| $X_2, Y_1$ | −30 |
| $X_3, Y_1$ | −25 |
| $X_4, Y_1$ | −20 |
| ⋮ | ⋮ |

HEIGHT DETECTING APPARATUS

BACKGROUND OF THE INVENTION

1. Field of the Invention

The present invention relates to a height detecting apparatus for detecting the height of a workpiece such as a semiconductor wafer held on a chuck table included in a processing machine such as a laser processing machine.

2. Description of the Related Art

In a semiconductor device fabrication process, a plurality of crossing division lines are formed on the front side of a substantially disk-shaped semiconductor wafer to thereby define a plurality of separate regions where a plurality of devices such as ICs and LSIs are respectively formed. The semiconductor wafer is cut along the division lines to thereby divide the regions where the devices are formed from each other, thus obtaining individual semiconductor chips.

As a method of dividing the semiconductor wafer as a workpiece along the division lines, there has been tried a laser processing method using a pulsed laser beam having a transmission wavelength to the wafer, wherein the pulsed laser beam is applied to the wafer in the condition where the focal point of the pulsed laser beam is set inside the wafer in an area to be divided. A wafer dividing method using this laser processing method includes the steps of applying a pulsed laser beam having a transmission wavelength (e.g., 1064 nm) to the wafer in the condition where the focal point of the pulsed laser beam is set inside the wafer from one side thereof, thereby continuously forming a modified layer inside the wafer along each division line, and next applying an external force to the wafer along each division line where the strength has been reduced by the formation of the modified layer, thereby dividing the workpiece (see Japanese Patent No. 3408805, for example). In the case of forming a modified layer inside a workpiece along each division line by using a laser beam as mentioned above, it is important to set the focal point of the laser beam inside the workpiece at a predetermined depth from the upper surface of the workpiece.

As another method of dividing a platelike workpiece such as a semiconductor wafer, there has been proposed a method including the steps of applying a pulsed laser beam to the workpiece along the division lines formed on the workpiece, thereby forming a laser processed groove on the workpiece along each division line, and next breaking the workpiece along each laser processed groove by using a mechanical breaking apparatus (see Japanese Patent Laid-open No. 2010-272697, for example). Also in the case of forming such a laser processed groove along each division line formed on the workpiece as mentioned above, it is important to set the focal point of the laser beam at a predetermined height in the workpiece.

However, a platelike workpiece such as a semiconductor wafer has undulation, so that there are variations in thickness of the workpiece. Accordingly, it is difficult to perform uniform laser processing. More specifically, in the case of forming a modified layer inside a wafer along each division line, variations in thickness of the wafer may cause a problem such that the modified layer cannot be uniformly formed at a predetermined depth in relation to refractive index in applying a laser beam. Further, also in the case of forming a laser processed groove along each division line on a wafer, variations in thickness of the wafer may cause a problem such that the laser processed groove cannot be formed at a uniform depth. To solve these problems, Japanese Patent Laid-open No. 2011-82354 has disclosed a height detecting apparatus capable of detecting the height of the upper surface of a workpiece such as a semiconductor wafer held on a chuck table.

SUMMARY OF THE INVENTION

However, the height detecting apparatus disclosed in Japanese Patent Laid-open No. 2011-82354 is a technique of applying light from light emitting means obliquely to the upper surface of the workpiece, reflecting the applied light from the upper surface of the workpiece, and detecting the reflected light from the upper surface of the workpiece to thereby detect the height of the upper surface of the workpiece according to the positions of detection of the reflected light. Accordingly, variations in height of the workpiece may cause a problem such that the light is applied to a position deviated from each division line and that the height of the upper surface of the workpiece at a proper position cannot be detected.

It is therefore an object of the present invention to provide a height detecting apparatus which can accurately detect the height of a set area in a workpiece such as a semiconductor wafer held on workpiece holding means.

In accordance with an aspect of the present invention, there is provided a height detecting apparatus including: workpiece holding means for holding a workpiece; height detecting means for detecting the height of the workpiece held on the workpiece holding means; and moving means for relatively moving the workpiece holding means and the height detecting means; the height detecting means including a light source having a predetermined wavelength band, a first single-mode fiber for transmitting light emitted from the light source, a fiber coupler connected to the first single-mode fiber, a Fabry-Perot tunable filter connected to the first single-mode fiber between the light source and the fiber coupler for sequentially sweeping light having a single wavelength from the wavelength band at predetermined cycles and then transmitting the light having the single wavelength, a chromatic aberration lens for focusing the light transmitted from the Fabry-Perot tunable filter and applying this light to the workpiece held on the workpiece holding means, a second single-mode fiber for transmitting return light reflected from the workpiece, next passed through the chromatic aberration lens, and next branched by the fiber coupler, a photodetector for detecting the return light emerging from the second single-mode fiber and outputting a signal corresponding to the intensity of the return light detected above, and control means having a memory for storing a table setting the relation between wavelength and height; the control means determining the wavelength corresponding to the highest light intensity from the wavelengths detected by the photodetector in synchronism with the predetermined cycles of sweeping of the light having the single wavelength by the Fabry-Perot tunable filter, and then checking this determined wavelength against the wavelength and height set in the table, thereby determining the height of the workpiece held on the workpiece holding means.

Preferably, the control means determines the height of the workpiece held on the workpiece holding means according to X coordinates set in the direction of relative movement of the workpiece holding means and the height detecting means by the moving means, and then stores values for the height determined according to the X coordinates into the memory.

Preferably, the height detecting means is mounted in a processing machine including the workpiece holding means for holding the workpiece, processing means for processing the workpiece held on the workpiece holding means, X moving means for relatively moving the workpiece holding means and the processing means in an X direction, and Y moving means for relatively moving the workpiece holding means and the processing means in a Y direction perpendicular to the X direction.

According to the height detecting apparatus of the present invention, the control means determines the wavelength corresponding to the highest light intensity from the wavelengths detected by the photodetector in synchronism with the predetermined cycles of sweeping of the light having the single wavelength by the Fabry-Perot tunable filter, and then checks this determined wavelength against the wavelength and height set in the table, thereby determining the height of the workpiece held on the workpiece holding means. Accordingly, it is possible to solve the problem that the light may be applied to a position deviated from the detected position on the workpiece and that the height of the workpiece at this deviated position may be detected.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 6 is a control table setting the relation between wavelength and height;

DETAILED DESCRIPTION OF THE PREFERRED EMBODIMENT

Figure 1:
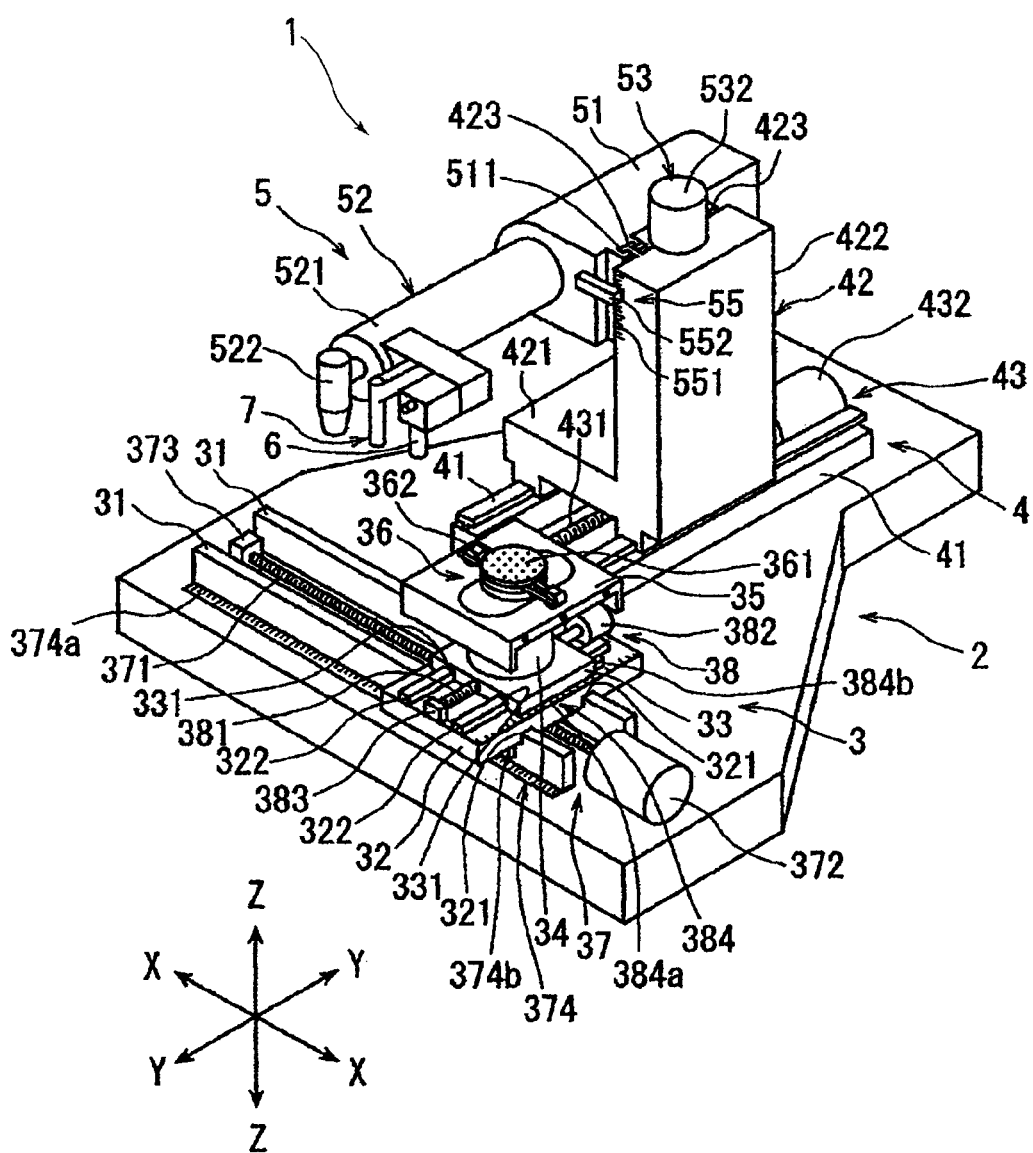
FIG. 1 is a perspective view of a laser processing machine incorporating a height detecting apparatus according to a preferred embodiment of the present invention.

A preferred embodiment of the height detecting apparatus according to the present invention will now be described in detail with reference to the attached drawings. FIG. 1 is a perspective view of a laser processing machine 1 as a processing machine incorporating the height detecting apparatus according to the present invention. The laser processing machine 1 shown in FIG. 1 includes a stationary base 2, a chuck table mechanism 3 for holding a workpiece, the chuck table mechanism 3 being provided on the stationary base 2 so as to be movable in the X direction (feeding direction) shown by an arrow X, a laser beam applying unit supporting mechanism 4 provided on the stationary base 2 so as to be movable in the Y direction (indexing direction) shown by an arrow Y perpendicular to the X direction, and a laser beam applying unit 5 provided on the laser beam applying unit supporting mechanism 4 so as to be movable in the Z direction (focal position adjusting direction) shown by an arrow Z.

The chuck table mechanism 3 includes a pair of guide rails 31 provided on the stationary base 2 so as to extend parallel to each other in the X direction, a first slide block 32 provided on the guide rails 31 so as to be movable in the X direction, a second slide block 33 provided on the first slide block 32 so as to be movable in the Y direction, a cover table 35 supported by a cylindrical member 34 standing on the second slide block 33, and a chuck table 36 as workpiece holding means. The chuck table 36 has a vacuum chuck 361 formed of a porous material. A workpiece such as a disk-shaped semiconductor wafer is adapted to be held under suction on the vacuum chuck 361 by operating suction means (not shown). The chuck table 36 is rotatable by a pulse motor (not shown) provided in the cylindrical member 34. Further, the chuck table 36 is provided with clamps 362 for fixing an annular frame to be hereinafter described.

The lower surface of the first slide block 32 is formed with a pair of guided grooves 321 for slidably engaging the pair of guide rails 31 mentioned above. A pair of guide rails 322 are provided on the upper surface of the first slide block 32 so as to extend parallel to each other in the Y direction. Accordingly, the first slide block 32 is movable in the X direction along the guide rails 31 by the slidable engagement of the guided grooves 321 with the guide rails 31. The chuck table mechanism 3 further includes X moving means 37 for moving the first slide block 32 in the X direction along the guide rails 31. The X moving means 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31 by operating the pulse motor 372 to normally or reversely rotate the externally threaded rod 371.

The laser processing machine 1 includes X position detecting means 374 for detecting the X position of the chuck table 36. The X position detecting means 374 includes a linear scale 374a extending along one of the guide rails 31 and a read head 374b provided on the first slide block 32 and movable along the linear scale 374a together with the first slide block 32. The read head 374b of the X position detecting means 374 transmits a pulse signal of one pulse every 0.1 µm in this preferred embodiment to control means which will be hereinafter described. This control means counts the number of pulses as the pulse signal input from the read head 374b to thereby detect the X position of the chuck table 36.

The lower surface of the second slide block 33 is formed with a pair of guided grooves 331 for slidably engaging the pair of guide rails 322 provided on the upper surface of the first slide block 32 as mentioned above. Accordingly, the second slide block 33 is movable in the Y direction along the guide rails 322 by the slidable engagement of the guided grooves 331 with the guide rails 322. The chuck table mechanism 3 further includes first Y moving means 38 for moving the second slide block 33 in the Y direction along the guide rails 322. The first Y moving means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322 by operating the pulse motor 382 to normally or reversely rotate the externally threaded rod 381.

The laser processing machine 1 includes Y position detecting means 384 for detecting the Y position of the chuck table 36. The Y position detecting means 384 includes a linear scale 384a extending along one of the guide rails 322 and a read head 384b provided on the second slide block 33 and movable along the linear scale 384a together with the second slide block 33. The read head 384b of the Y position detecting means 384 transmits a pulse signal of one pulse every 1 µm in this preferred embodiment to the control means. This control means counts the number of pulses as the pulse signal input from the read head 384b to thereby detect the Y position of the chuck table 36.

The laser beam applying unit supporting mechanism 4 includes a pair of guide rails 41 provided on the stationary base 2 so as to extend parallel to each other in the Y direction and a movable support base 42 provided on the guide rails 41 so as to be movable in the Y direction. The movable support base 42 is composed of a horizontal portion 421 slidably supported to the guide rails 41 and a vertical portion 422 extending vertically upward from the upper surface of the horizontal portion 421. Further, a pair of guide rails 423 are provided on one side surface of the vertical portion 422 so as to extend parallel to each other in the Z direction. The laser beam applying unit supporting mechanism 4 further includes second Y moving means 43 for moving the movable support base 42 in the Y direction along the guide rails 41. The second Y moving means 43 includes an externally threaded rod 431 extending parallel to the guide rails 41 so as to be interposed therebetween and a pulse motor 432 as a drive source for rotationally driving the externally threaded rod 431. The externally threaded rod 431 is rotatably supported at one end thereof to a bearing block (not shown) fixed to the stationary base 2 and is connected at the other end to the output shaft of the pulse motor 432 so as to receive the torque thereof. The externally threaded rod 431 is engaged with a tapped through hole formed in an internally threaded block (not shown) projecting from the lower surface of the horizontal portion 421 at a central portion thereof. Accordingly, the movable support base 42 is moved in the Y direction along the guide rails 41 by operating the pulse motor 432 to normally or reversely rotate the externally threaded rod 431.

The laser beam applying unit 5 includes a unit holder 51 and laser beam applying means 52 mounted to the unit holder 51. The unit holder 51 is formed with a pair of guided grooves 511 (one of which being shown) for slidably engaging the pair of guide rails 423 provided on the vertical portion 422 of the movable support base 42. Accordingly, the unit holder 51 is supported to the movable support base 42 so as to be movable in the Z direction by the slidable engagement of the guided grooves 511 with the guide rails 423.

The laser beam applying unit 5 further includes Z moving means 53 for moving the unit holder 51 along the guide rails 423 in the Z direction. The Z moving means 53 includes an externally threaded rod (not shown) extending parallel to the guide rails 423 so as to be interposed therebetween and a pulse motor 532 as a drive source for rotationally driving this externally threaded rod. Accordingly, the unit holder 51 and the laser beam applying means 52 are moved in the Z direction along the guide rails 423 by operating the pulse motor 532 to normally or reversely rotate this externally threaded rod. In this preferred embodiment, when the pulse motor 532 is normally operated, the laser beam applying means 52 is moved upward, whereas when the pulse motor 532 is reversely operated, the laser beam applying means 52 is moved downward.

The laser beam applying unit 5 is provided with Z position detecting means 55 for detecting the Z position of the laser beam applying means 52. The Z position detecting means 55 includes a linear scale 551 extending along one of the guide rails 423 and a read head 552 provided on the unit holder 51 and movable along the linear scale 551 together with the unit holder 51. The read head 552 of the Z position detecting means 55 transmits a pulse signal of one pulse every 1 µm in this preferred embodiment to the control means.

The laser beam applying means 52 includes a cylindrical casing 521 extending in a substantially horizontal direction. Although not shown, pulsed laser beam oscillating means is provided in the casing 521. The pulsed laser beam oscillating means includes a pulsed laser oscillator such as a YAG laser oscillator or a YVO4 laser oscillator and repetition frequency setting means. Focusing means 522 for focusing a pulsed laser beam oscillated from the pulsed laser beam oscillating means is mounted on the front end of the casing 521.

The laser processing machine 1 further includes imaging means 6 provided at the front end portion of the casing 521 for detecting a subject area of the workpiece to be laser-processed by the laser beam applying means 52. The imaging means 6 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 6 is transmitted to the control means.

Figure 2:
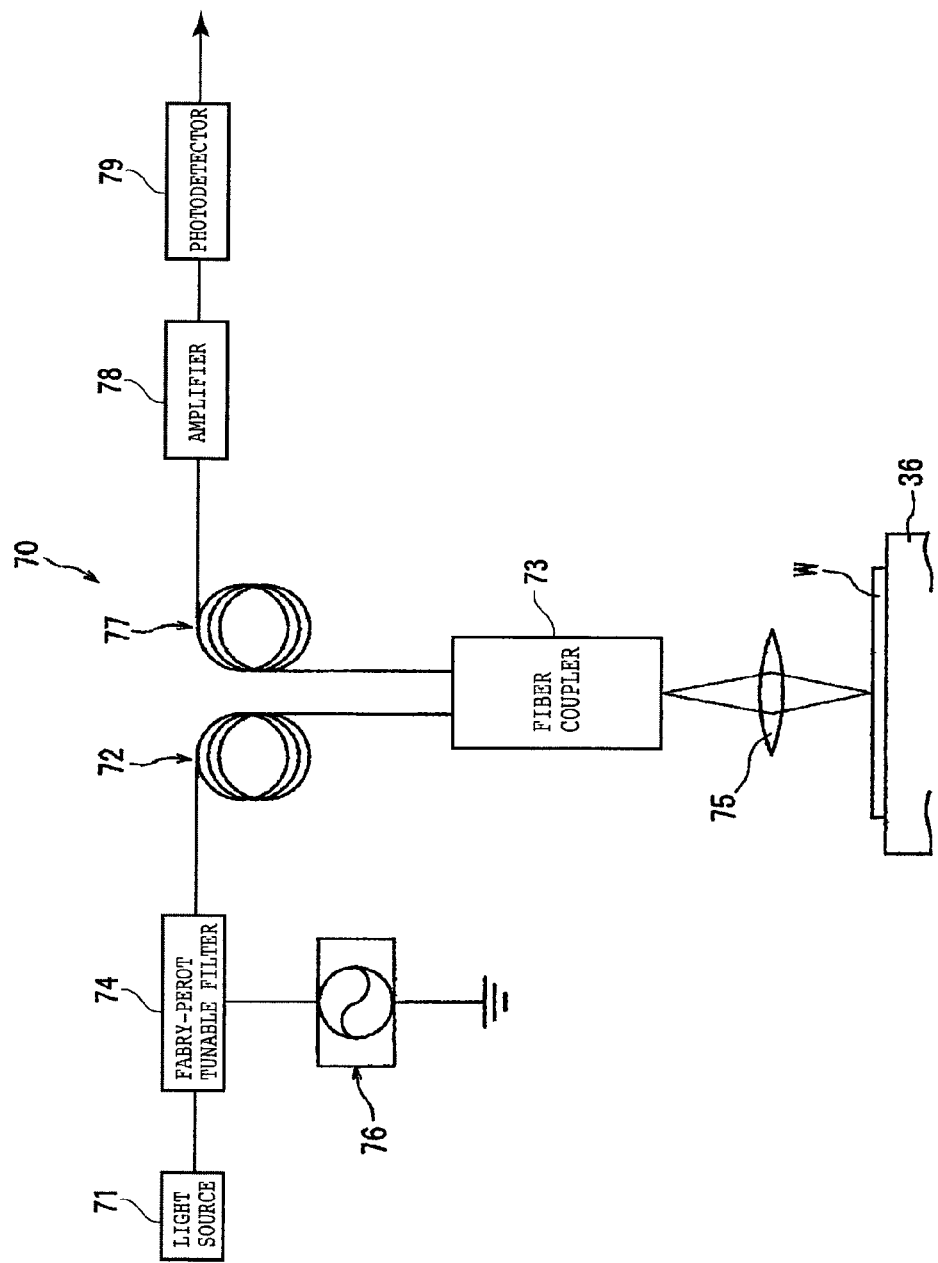
FIG. 2 is a block diagram showing the configuration of height detecting means constituting the height detecting apparatus included in the laser processing machine shown in FIG. 1.

The laser processing machine 1 further includes a height detecting apparatus 7 provided at the front end portion of the casing 521 of the laser beam applying means 52 for detecting the height of the upper surface of the workpiece held on the chuck table 36. The height detecting apparatus 7 includes height detecting means 70 shown in FIG. 2. The height detecting means 70 shown in FIG. 2 includes a light source 71 having a predetermined wavelength band, a first single-mode fiber 72 for transmitting light emitted from the light source 71, a fiber coupler 73 connected to the first single-mode fiber 72, a Fabry-Perot tunable filter 74 connected to the first single-mode fiber 72 between the light source 71 and the fiber coupler 73 for sequentially sweeping light having a single wavelength from the wavelength band at predetermined cycles and then transmitting the light having the single wavelength, and a chromatic aberration lens 75 for focusing the light transmitted from the Fabry-Perot tunable filter 74 and applying this light to a workpiece W held on the chuck table 36.

Figure 3:
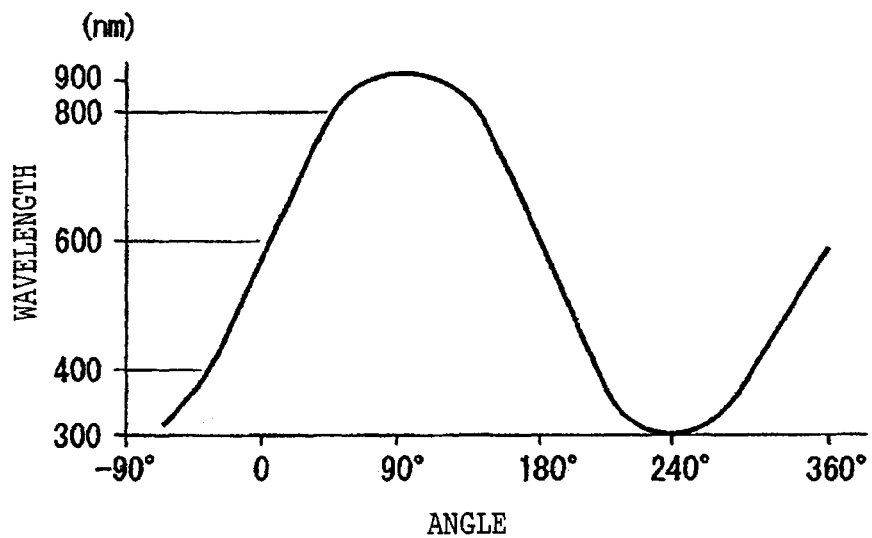
FIG. 3 is a graph for illustrating a condition where a Fabry-Perot tunable filter included in the height detecting means shown in FIG. 2 sequentially sweeps light having different wavelengths at predetermined cycles along an alternating wave applied thereto and then transmits the light having different wavelengths.
Figure 4:
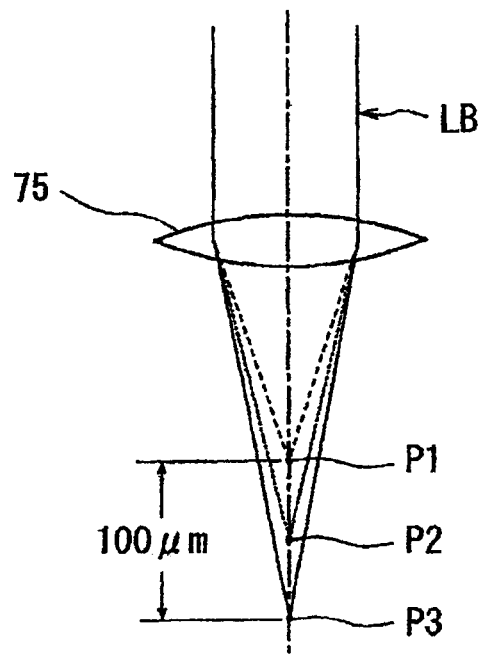
FIG. 4 is a schematic view for illustrating a condition where the light transmitted from the Fabry-Perot tunable filter is focused by a chromatic aberration lens included in the height detecting means shown in FIG. 2.

The light source 71 emits light having a wavelength band of 300 nm to 900 nm, for example. The Fabry-Perot tunable filter 74 is connected to alternating voltage applying means 76 for generating an alternating wave having a predetermined frequency (e.g., 50 kHz). As shown in FIG. 3, the Fabry-Perot tunable filter 74 sequentially sweeps light having different wavelengths at predetermined cycles along the alternating wave generated by the alternating voltage applying means 76. Preferably, the different wavelengths of the light to be swept along the alternating wave fall in a region of 400 nm to 800 nm, which is a nearly straight region of the alternating wave. The chromatic aberration lens 75 functions to vary the focal position of incident light according to the wavelength of the incident light as shown in FIG. 4. For example, light having a wavelength of 400 nm is focused at a point P1, light having a wavelength of 600 nm is focused at a point P2, and light having a wavelength of 800 nm is focused at a point P3. In this preferred embodiment, the distance between the focal point P1 and the focal point P3 is set to 100 μm with the focal point P2 set as the center therebetween.

Referring back to FIG. 2, the light applied through the chromatic aberration lens 75 to the workpiece W is reflected from the upper surface of the workpiece W, and resultant return light is passed through the chromatic aberration lens 75 to enter the fiber coupler 73. The height detecting means 70 further includes a second single-mode fiber 77 for transmitting the return light branched by the fiber coupler 73, an amplifier 78 for amplifying the return light emerging from the second single-mode fiber 77, and a photodetector 79 for detecting the return light amplified by the amplifier 78 and outputting a signal corresponding to the intensity of the return light detected above. The photodetector 79 transmits to the control means the light intensities respectively corresponding to the different wavelengths of the return light detected by the photodetector 79.

Figure 5:
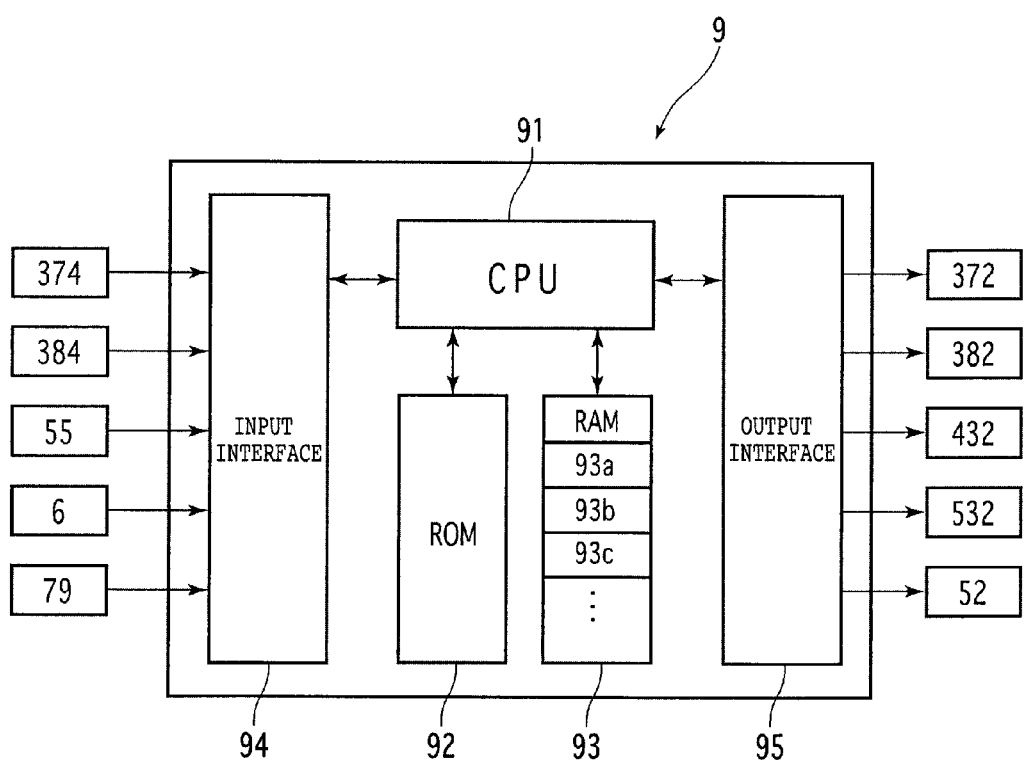
FIG. 5 is a block diagram showing the configuration of control means included in the laser processing machine shown in FIG. 1.

The laser processing machine 1 includes control means 9 shown in FIG. 5. The control means 9 is configured by a computer, and it includes a central processing unit (CPU) 91 for performing operational processing according to a control program, a read only memory (ROM) 92 preliminarily storing the control program, a random access memory (RAM) 93 for storing the results of computation, etc., an input interface 94, and an output interface 95. Detection signals from the X position detecting means 374, the Y position detecting means 384, the Z position detecting means 55, the imaging means 6, and the photodetector 79 are input into the input interface 94 of the control means 9. On the other hand, control signals are output from the output interface 95 of the control means 9 to the pulse motor 372, the pulse motor 382, the pulse motor 432, the pulse motor 532, and the laser beam applying means 52.

The random access memory (RAM) 93 includes a first memory area 93a for storing a control table setting the relation between wavelength and height shown in FIG. 6, a second memory area 93b for storing data on design value for a workpiece to be hereinafter described, a third memory area 93c for storing variations in height of the workpiece at XY coordinates with respect to a reference height, and other memory areas. As shown in FIG. 6, the control table setting the relation between wavelength and height is set in such a manner that the height at the wavelength of 600 nm is set as 0 and that when the wavelength is shorter than 600 nm, the height is set as + (plus) (μm), whereas when the wavelength is longer than 600 nm, the height is set as − (minus) (μm). The control means 9 determines the wavelength corresponding to the highest light intensity from the wavelengths detected by the photodetector 79 in synchronism with the predetermined cycles of sweeping of the light having a single wavelength by the Fabry-Perot tunable filter 74, and then checks this determined wavelength against the wavelength and height set in the control table shown in FIG. 6, thereby determining the height of the workpiece W held on the chuck table 36, that is, determining the variations in height with respect to the height (0) (reference height) set at the wavelength of 600 nm.

Figure 7:
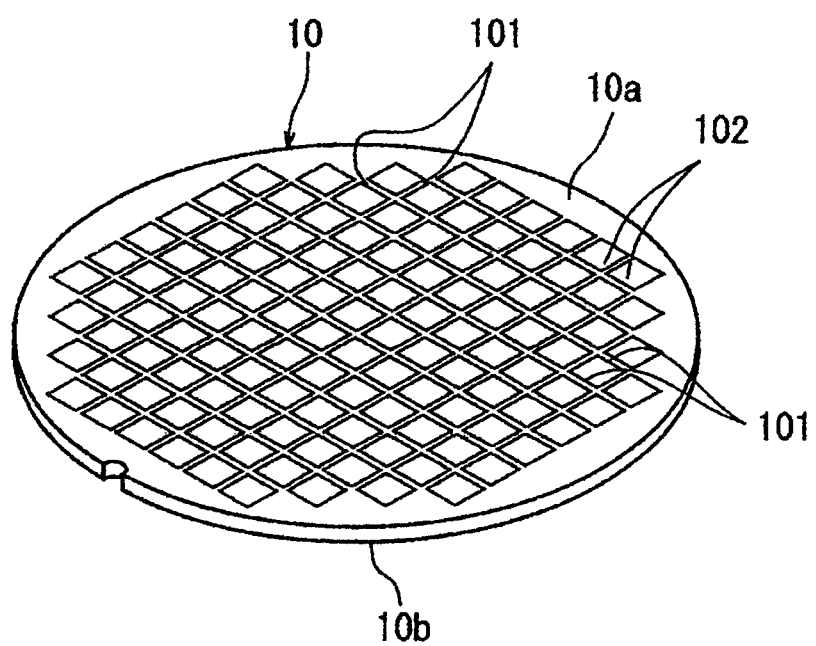
FIG. 7 is a perspective view of a semiconductor wafer as a workpiece.
Figure 8:
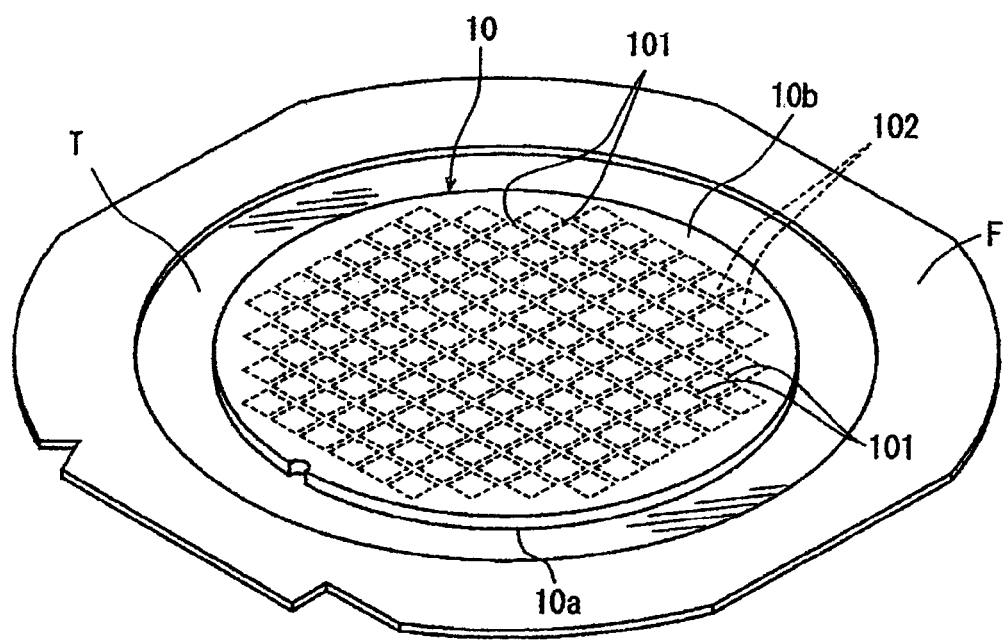
FIG. 8 is a perspective view showing a condition where the semiconductor wafer shown in FIG. 7 is attached to a protective tape supported to an annular frame.

The operation of the laser processing machine 1 incorporating the height detecting apparatus 7 configured above will now be described. FIG. 7 is a perspective view of a semiconductor wafer 10 as the workpiece to be laser-processed. The semiconductor wafer 10 shown in FIG. 7 is formed from a silicon wafer having a thickness of 200 μm, for example. The semiconductor wafer 10 has a front side 10a and a back side 10b. A plurality of crossing division lines 101 are formed on the front side 10a of the semiconductor wafer 10, thereby defining a plurality of rectangular separate regions where a plurality of devices 102 such as ICs and LSIs are respectively formed. As shown in FIG. 8, the semiconductor wafer 10 is attached to a protective tape T supported to an annular frame F (protective tape attaching step). More specifically, the protective tape T is formed from a synthetic resin sheet such as a polyolefin sheet and has a thickness of 300 μm, for example. The peripheral portion of the protective tape T is preliminarily supported to the annular frame F, and the front side 10a of the semiconductor wafer 10 is attached to the protective tape T so as to be surrounded by the annular frame F. Accordingly, the back side 10b of the semiconductor wafer 10 is oriented upward, or exposed in the condition where the semiconductor wafer 10 is attached to the protective tape T.

Laser processing using the laser processing machine 1 is performed by applying a laser beam along the division lines 101 of the semiconductor wafer 10 to thereby form a modified layer inside the semiconductor wafer 10 along each division line 101. In forming the modified layer inside the semiconductor wafer 10, variations in thickness of the semiconductor wafer 10 may cause a problem such that the modified layer cannot be uniformly formed at a predetermined depth. To cope with this problem, the height of the upper surface of the semiconductor wafer 10 held on the chuck table 36 is measured by the height detecting apparatus 7 prior to performing the laser processing in this preferred embodiment.

In measuring the height of the upper surface of the semiconductor wafer 10 held on the chuck table 36, the semiconductor wafer 10 supported through the protective tape T to the annular frame F is placed on the chuck table 36 of the laser processing machine 1 shown in FIG. 1 in the condition where the protective tape T comes into contact with the upper surface of the chuck table 36. Thereafter, the suction means is operated to hold the semiconductor wafer 10 through the protective tape T on the chuck table 36 under suction (wafer holding step). Accordingly, the semiconductor wafer 10 is held through the protective tape T on the chuck table 36 in the condition where the back side 10b of the semiconductor wafer 10 is oriented upward. After performing the wafer holding step, the X moving means 37 is operated to move the chuck table 36 holding the semiconductor wafer 10 to a position directly below the imaging means 6.

In the condition where the chuck table 36 is positioned directly below the imaging means 6, an alignment operation is performed by the imaging means 6 and the control means 9 to detect the subject area of the semiconductor wafer 10 to be laser-processed. In other words, the imaging means 6 and the control means 9 perform the alignment operation for detecting whether or not the division lines 101 extending in a first direction on the semiconductor wafer 10 are parallel to the X direction. Similarly, the alignment operation is performed for the remaining division lines 101 extending in a second direction perpendicular to the first direction. Although the front side 10a on which the division lines 101 of the semiconductor wafer 10 are formed is oriented downward, the division lines 101 can be imaged from the back side 10b of the semiconductor wafer 10 because the imaging means 6 includes the infrared light applying means for applying infrared light, the optical system for capturing the infrared light, and the imaging device (infrared CCD) for outputting an electrical signal corresponding to the infrared light.

Figure 9A:
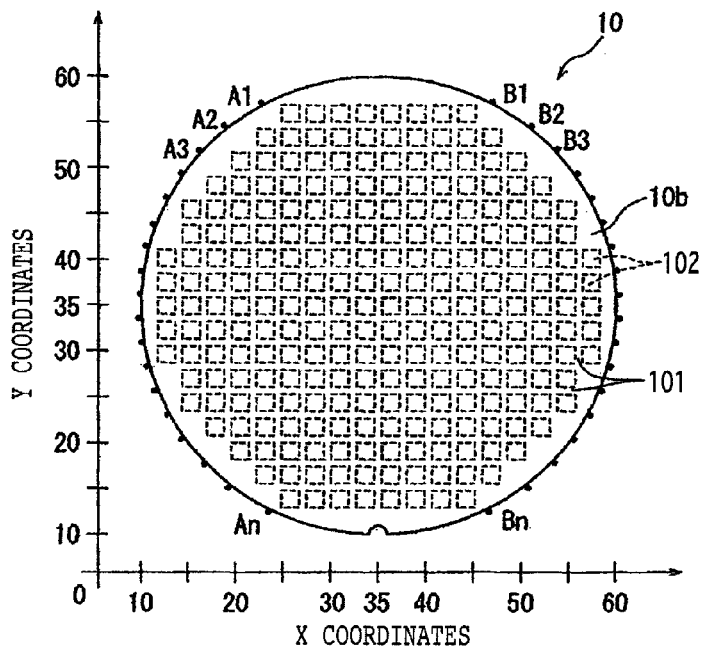
FIG. 9A is a plan view showing the relation between the semiconductor wafer shown in FIG. 7 and XY coordinates in the condition where the wafer is held at a predetermined position on a chuck table included in the laser processing machine shown in FIG. 1.
Figure 9B:
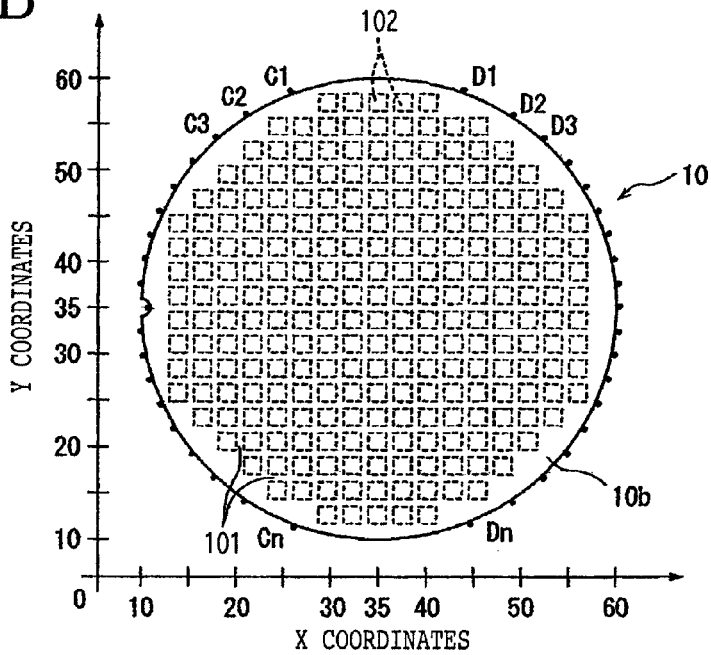
FIG. 9B is a plan view showing a condition obtained by 90° rotating the semiconductor wafer shown in FIG. 9A.

In the condition where the alignment operation has been performed as mentioned above, the semiconductor wafer 10 held on the chuck table 36 is set at the coordinate position shown in FIG. 9A. FIG. 9B shows a condition obtained by 90° rotating the chuck table 36, i.e., the division lines 101 from the condition shown in FIG. 9A.

In the coordinate position shown in FIG. 9A, reference symbols A1 to An denote feed start position coordinate values on the division lines 101 extending in the first direction on the semiconductor wafer 10, and reference symbols B1 to Bn denote feed end position coordinate values on the division lines 101 extending in the first direction on the semiconductor wafer 10. Similarly, in the condition shown in FIG. 9B, reference symbols C1 to Cn denote feed start position coordinate values on the division lines 101 extending in the second direction on the semiconductor wafer 10, and reference symbols D1 to Dn denote feed end position coordinate values on the division lines 101 extending in the second direction on the semiconductor wafer 10. These coordinate values (A1 to An), (B1 to Bn), (C1 to Cn), and (D1 to Dn) are stored as data on design value for the workpiece in the second memory area 93b of the random access memory (RAM) 93 of the control means 9.

Figures 10, 11:
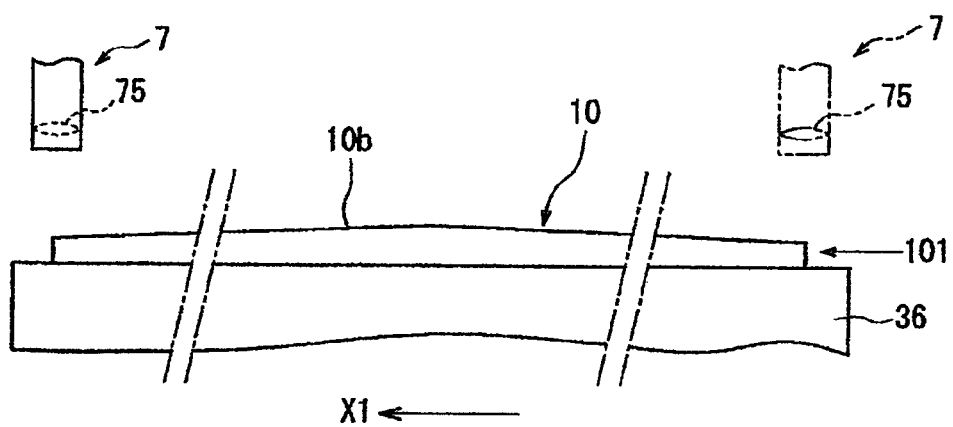
FIG. 10 is a table showing variations in height at XY coordinates on the semiconductor wafer with respect to a reference height according to height data detected by the height detecting means shown in FIG. 2.
FIG. 11 is a sectional side view for illustrating a height detecting step to be performed by the height detecting apparatus shown in FIG. 1.

After detecting the division lines 101 of the semiconductor wafer 10 held on the chuck table 36 to perform the alignment for the detected positions, the chuck table 36 is moved to position the uppermost division line 101 as viewed in FIG. 9A directly below the chromatic aberration lens 75 of the height detecting apparatus 7. Thereafter, one end (left end as viewed in FIG. 11) of this uppermost division line 101 of the semiconductor wafer 10 corresponding to the feed start position coordinate value (A1) (see FIG. 9A) is positioned directly below the chromatic aberration lens 75 as shown in FIG. 11. Thereafter, the height detecting apparatus 7 is operated and the chuck table 36 is moved in the direction shown by an arrow X1 in FIG. 11 at a predetermined feed speed (e.g., 200 mm/second) until the other end (right end as viewed in FIG. 11) of the uppermost division line 101 corresponding to the feed end position coordinate value (B1) (see FIG. 9A) reaches the position directly below the chromatic aberration lens 75, according to the detection signal from the X position detecting means 374 (height detecting step). As a result, the height on the uppermost division line 101 of the semiconductor wafer 10 shown in FIG. 9A can be detected. In other words, variations in height of the semiconductor wafer 10 along the uppermost division line 101 with respect to the height (0) (reference height) set at the wavelength of 600 nm can be detected.

Thereafter, the control means 9 determines variations in height at XY coordinates on the uppermost division line 101 of the semiconductor wafer 10 with respect to the reference height as shown in FIG. 10, according to the variations with respect to the height (0) set at the wavelength of 600 nm. The variations in height at the XY coordinates as determined above are stored into the third memory area 93c of the random access memory (RAM) 93. Similarly, this height detecting step is performed along all of the division lines 101 of the semiconductor wafer 10 to store variations in height at XY coordinates on each division line 101 with respect to the reference height into the third memory area 93c of the random access memory (RAM) 93. As described above, the height detecting apparatus 7 determines the wavelength corresponding to the highest light intensity in the return light obtained by perpendicularly applying light through the chromatic aberration lens 75 to the upper surface of the workpiece W held on the chuck table 36 and reflecting the light from the upper surface of the workpiece W, thereby detecting the height of the workpiece W. Accordingly, it is possible to solve the problem that the light may be applied to a position deviated from the division lines 101 and that the height of the workpiece W at this deviated position may be detected.

Figure 12A:
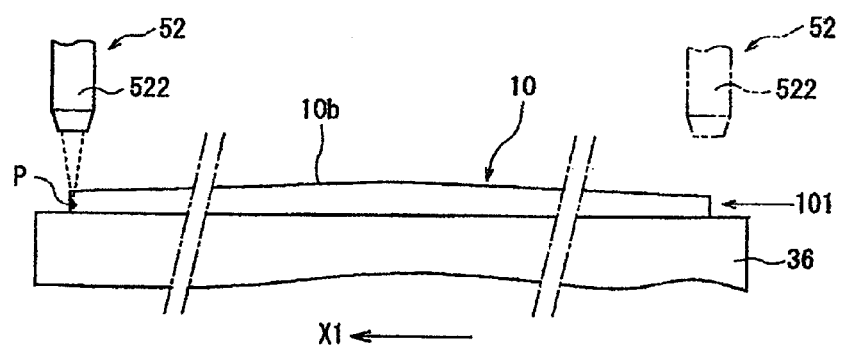
FIGS. 12A and 12B are sectional side views for illustrating a laser processing step of forming a modified layer inside the semiconductor wafer shown in FIG. 7 by using the laser processing machine shown in FIG. 1.

After performing the height detecting step along all of the division lines 101 of the semiconductor wafer 10 as mentioned above, a laser processing step is performed to form a modified layer inside the semiconductor wafer 10 along each division line 101. First, the chuck table 36 is moved to position the uppermost division line 101 as viewed in FIG. 9A directly below the focusing means 522 of the laser beam applying means 52. Thereafter, one end (left end as viewed in FIG. 12A) of this uppermost division line 101 corresponding to the feed start position coordinate value (A1) (see FIG. 9A) is positioned directly below the focusing means 522 as shown in FIG. 12A. Thereafter, the control means 9 operates the Z moving means 53 to set the focal point P of the pulsed laser beam to be applied from the focusing means 522 at a predetermined depth from the back side 10b (upper surface) of the semiconductor wafer 10. Thereafter, the control means 9 operates the laser beam applying means 52 to apply the pulsed laser beam from the focusing means 522 to the semiconductor wafer 10. At the same time, the chuck table 36 is moved in the direction shown by an arrow X1 in FIG. 12A at a predetermined feed speed (laser processing step).

Figure 12B:
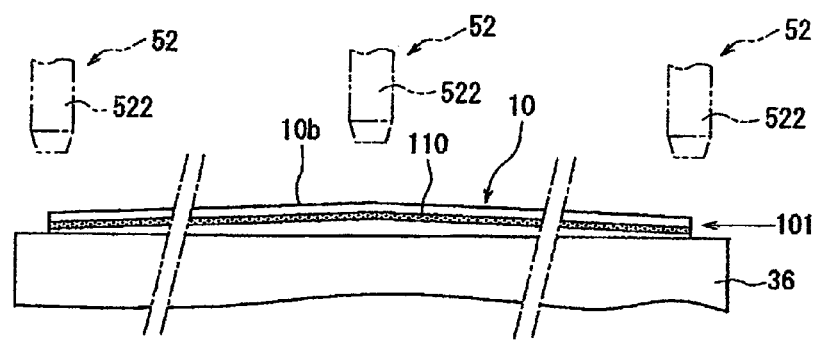

When the other end (right end as viewed in FIG. 12B) of the uppermost division line 101 reaches the position directly below the focusing means 522 as shown in FIG. 12B, the application of the pulsed laser beam is stopped and the movement of the chuck table 36 is also stopped. In this laser processing step, the control means 9 controls the pulse motor 532 of the Z moving means 53 according to the variations in height at XY coordinates on this uppermost division line 101 with respect to the reference height, which variations are previously stored in the third memory area 93c of the random access memory (RAM) 93. Accordingly, the focusing means 522 is vertically moved according to the height of the uppermost division line 101 as shown in FIG. 12B. As a result, a modified layer 110 is formed inside the semiconductor wafer 10 along the uppermost division line 101 at the predetermined depth from the back side 10b (upper surface) so that the modified layer 110 becomes parallel to the back side 10b (upper surface) as shown in FIG. 12B.

For example, the laser processing step mentioned above may be performed under the following processing conditions.

Laser: YVO4 pulsed laser
    Wavelength: 1040 nm
    Repetition frequency: 200 kHz
    Average power: 1 W
    Focused spot diameter: 1 μm
    Work feed speed: 300 mm/second Similarly, the laser processing step is performed along all of the division lines 101 extending in the first direction on the semiconductor wafer 10. Thereafter, the chuck table 36 is rotated 90° to similarly perform the laser processing step along all of the remaining division lines 101 extending in the second direction perpendicular to the first direction on the semiconductor wafer 10. After thus performing the laser processing step along all of the division lines 101 of the semiconductor wafer 10, the chuck table 36 holding the semiconductor wafer 10 is returned to the original position where the semiconductor wafer 10 has been loaded before processing, and the suction holding of the semiconductor wafer 10 is then canceled at this original position. Thereafter, the semiconductor wafer 10 is transferred by any transfer means (not shown) to a position where a dividing step is to be performed.

While the height detecting apparatus according to the present invention is applied to a laser processing machine for laser-processing a workpiece held on a chuck table in the above preferred embodiment, the present invention is applicable to various processing machines for processing a workpiece held on a chuck table.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A height detecting apparatus comprising:
for a chuck table holding a workpiece;
a height detector for detecting a height of said workpiece held on said chuck table; and
a mover for relatively moving said chuck table and said height detect;
said height detector including
a light source having a predetermined wavelength band,
a first single-mode fiber for transmitting light emitted from said light source,
a fiber coupler connected to said first single-mode fiber,
a Fabry-Perot tunable filter connected to said first single-mode fiber between said light source and said fiber coupler for sequentially sweeping light having a single wavelength from said wavelength band at predetermined cycles and then transmitting the light having the single wavelength,
a chromatic aberration lens for focusing the light transmitted from said Fabry-Perot tunable filter and applying the light to said workpiece held on said chuck table,
a return light reflected from said workpiece passing through said chromatic aberration lens, the return light being branched by said fiber coupler, the return light passing through a second single-mode fiber;
a photodetector for detecting the return light emerging from said second single-mode fiber and outputting a signal corresponding to an intensity of the return light detected above, and
controller having a memory for storing a table setting the relation between wavelength and height;
said controller determining the wavelength corresponding to a highest light intensity from the wavelengths detected by said photodetector in synchronism with the predetermined cycles of sweeping of the light having the single wavelength by said Fabry-Perot tunable filter, and then checking said determined wavelength against the wavelength and height set in said table, thereby determining the height of said workpiece held on said chuck table.

2. The height detecting apparatus according to claim 1, wherein said controller determines the height of said workpiece held on said chuck table according to X coordinates set in a direction of relative movement of said chuck table and said height detector by said mover, and then storing values for the height determined according to the X coordinates into said memory.

3. The height detecting apparatus according to claim 1, wherein said height detector is mounted in a processing machine including said chuck table for holding said workpiece, a processor for processing said workpiece held on said chuck table, an X mover for relatively moving said chuck table and said processor in an X direction, and a Y mover for relatively moving said chuck table and said processor in a Y direction perpendicular to said X direction.

\* \* \* \* \*